United States Patent

Kamata et al.

[11] Patent Number: 5,561,308
[45] Date of Patent: Oct. 1, 1996

[54] SEMICONDUCTOR DEVICE INCLUDING THIN FILM TRANSISTOR

[75] Inventors: Hideyuki Kamata, Kawasaki; Jumpei Kumagai, Yokohama, both of Japan

[73] Assignee: Kabushiki Kaisha Toshiba, Kawasaki, Japan

[21] Appl. No.: 366,776

[22] Filed: Dec. 30, 1994

[30] Foreign Application Priority Data

Jan. 18, 1994  [JP]  Japan .................... 6-003550

[51] Int. Cl.⁶ ................... H01L 29/78; H01L 29/786
[52] U.S. Cl. ............... 257/301; 257/302; 257/296; 257/329; 257/66; 257/68; 257/57; 257/906
[58] Field of Search .................... 257/301, 302, 257/296, 905, 906, 303, 304, 329, 330, 332, 57, 66, 68

[56] References Cited

U.S. PATENT DOCUMENTS

| | | | |
|---|---|---|---|
| 4,673,962 | 6/1987 | Chatterjee et al. | 257/302 |
| 4,829,017 | 5/1989 | Malhi | 257/302 |
| 5,164,917 | 11/1992 | Shichijo | 365/149 |
| 5,214,296 | 5/1993 | Nakata et al. | 257/304 |
| 5,365,097 | 11/1994 | Kenney | 257/330 |
| 5,382,816 | 1/1995 | Mitsui | 257/302 |

FOREIGN PATENT DOCUMENTS

| | | | |
|---|---|---|---|
| 2-26066 | 1/1990 | Japan . | |
| 0021462 | 1/1994 | Japan | 257/66 |

Primary Examiner—Robert P. Limanek
Assistant Examiner—David B. Hardy
Attorney, Agent, or Firm—Banner & Allegretti, Ltd.

[57] ABSTRACT

A semiconductor device comprises a semiconductor substrate of a first conductivity type, a first insulation film formed on the semiconductor substrate, a gate electrode and a second insulation film formed in sequence on the first insulation film, a trench being formed to extend through the second insulation film, the gate electrode and the first insulation film to an interior of the semiconductor substrate. A cylindrical gate insulation film is formed on a surface of the gate electrode which is exposed in the trench. A capacitor insulation film is formed on a surface of the semiconductor substrate exposed in the trench. A cylindrical conductive film is formed inside these insulation films. The cylindrical conductive film includes a region doped with an impurity of the first conductivity type and formed on a surface of the gate insulation film, a region doped with an impurity of a second conductivity type and formed on a surface of the second insulation film and a region doped with an impurity of the second conductivity type and formed on a surface of the capacitor insulation film. A conductive column is formed in a region surrounded by the cylindrical conductive film.

18 Claims, 10 Drawing Sheets

SEMICONDUCTOR DEVICE INCLUDING THIN FILM TRANSISTOR

BACKGROUND OF THE INVENTION

1. Field of the Invention

The present invention relates generally to a semiconductor device, and more particularly to a cell structure of a DRAM (Dynamic Random Access read and write Memory) using a thin film transistor.

2. Description of the Related Art

In recent years, the demand for greater integration of semiconductor devices has been increasing, as the devices become more and more refined in size and detail.

Figure 1A:
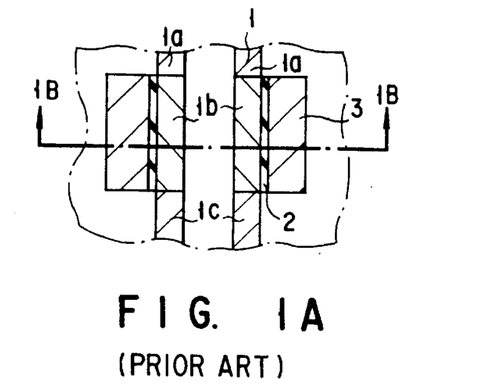
FIGS. 1A and 1B are cross-sectional views of a conventional ring channel TFT.

To meet the demand, a so-called ring channel TFT (Thin Film Transistor) having a cylindrical channel region has been proposed. FIG. 1A shows a longitudinal cross-sectional view of a conventional ring channel TFT. A cylindrical conductive layer 1 is formed of doped Si. The interior of the cylindrical conductive film is hollow. It is possible for the interior to be filled with a silicon oxide film (not shown). In the conductive film 1, a channel region 1b doped with a P-type impurity is formed between an N-type drain region 1a and an N-type source region 1c.

Figure 1B:
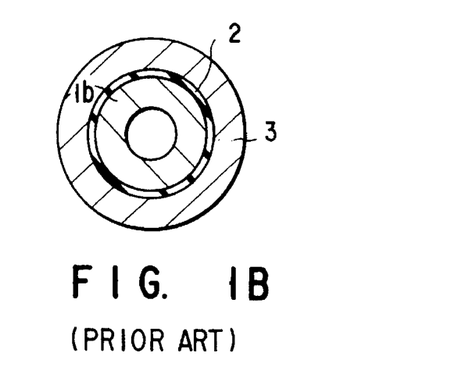

FIG. 1B is a cross sectional view of the cylindrical channel region taken along the line 1B—1B of FIG. 1A. As shown in FIG. 1B, a gate insulation film 2 and a ring-shaped gate electrode 3 made of conductive polycrystalline silicon are formed in this order on the outer surface of the cylindrical channel region 1b.

Figures 2A, 2B, 2C, 3:
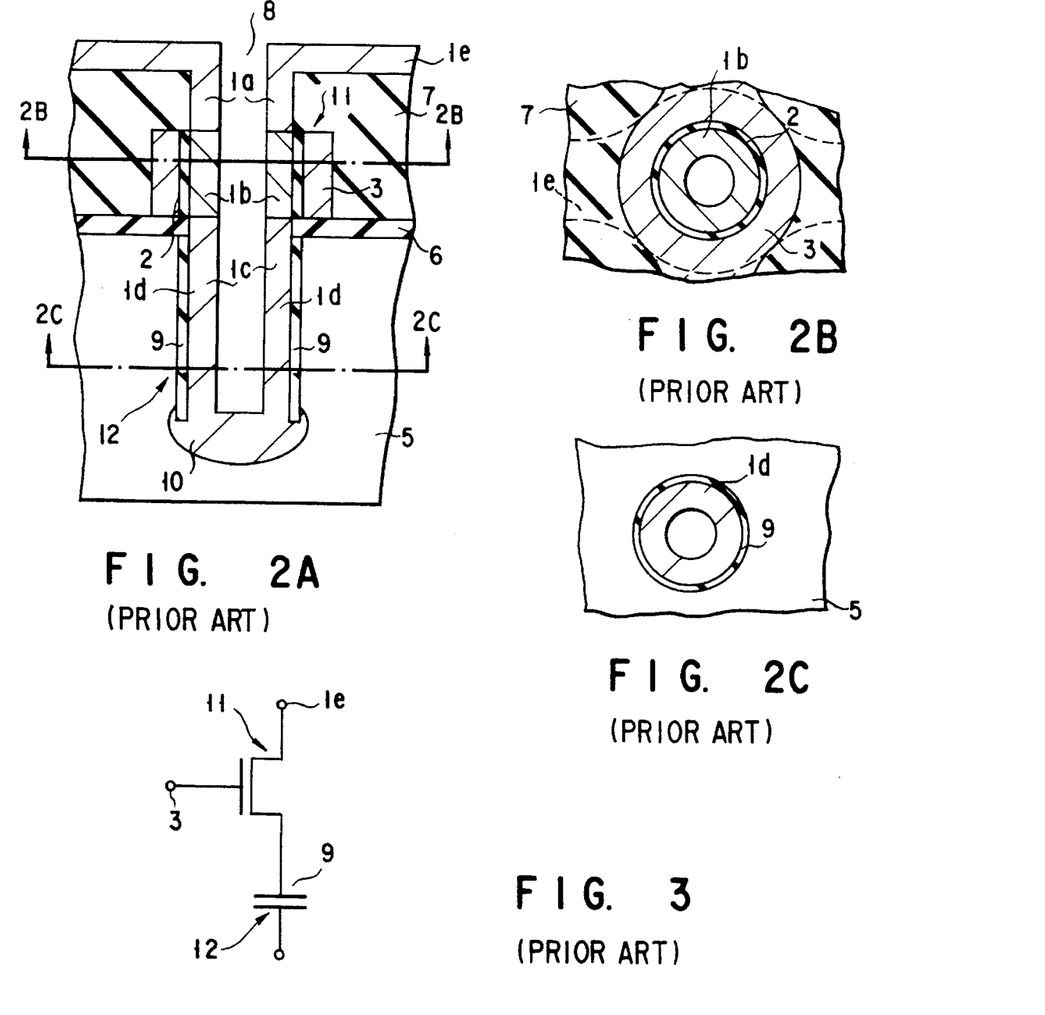
FIGS. 2A to 2C are cross sectional views of a DRAM including the conventional ring channel TFT.
FIG. 3 is a diagram showing an equivalent circuit of the DRAM including the conventional ring channel TFT.

FIGS. 2A to 2C show the cell structure of a DRAM containing the conventional ring channel TFT shown in FIGS. 1A and 1B.

As shown in FIG. 2A, a first insulation film 6 is formed on a surface of a P-type silicon substrate 5. A gate electrode 3, having a predetermined pattern, is formed on the first insulation film 6 and serves as a word line. A second insulation film 7 is formed on the gate electrode 3 and the first insulation film 6. A gate insulation film 2 is formed inside the trench 8 formed to a predetermined depth in the substrate 5 so as to cover the gate electrode 3. A capacitor insulation film 9 is formed on a side wall of the trench 8 in the substrate.

A doped Si film 1 is continuously formed on an upper surface of the second insulation film 7 and an inner surface of the trench 8. A hollow portion remains in the trench 8, but can be filed with a silicon oxide film (not shown), if necessary.

A region 1b of the doped Si film 1, which is formed on the gate insulation film 2, is doped with a P-type impurity and serves as a channel. The other portion of the doped Si film 1 is doped with an N-type impurity. An upper portion of the doped Si film above the channel region 1b is a drain region 1a and a lower portion of the doped Si film under the channel region 1b is a source region 1c.

A region 1e of the doped Si film 1, which is formed on the second insulation film 7, serves as a bit line. The portion of the source region 1c, which is in contact with the capacitor insulation film 9, serves as a charge storage layer. An $N^+$ region 10 is formed under the trench 8 in the substrate.

FIGS. 2B and 2C are cross-sectional views of the DRAM shown in FIG. 2A, taken along the lines 2B—2B and 2C—2C, respectively. As shown in FIG. 2B, the gate insulation film 2 and the gate electrode 3 are formed on the outer surface of the cylindrical channel region in this order in a cross section including the channel region 1b. As shown in FIG. 2C, the capacitor insulation film 9 covers an outer surface of a charge storage layer 1d.

The gate electrode 3, the gate insulation film 2, the channel region 1b, the drain region 1a and the source region 1c constitute a ring channel TFT 11. The silicon substrate 5, the capacitor insulation film 9 and the charge storage layer 1d constitute a cell capacitor 12.

FIG. 3 shows an equivalent circuit of the DRAM shown in FIG. 2. The word line 3 is electrically connected to a gate electrode of the ring channel TFT 11. Drain and source regions of the ring channel TFT 11 are electrically connected to the bit line 1e and the charge storage layer 1d of the cell capacitor 12, respectively.

As described above, in the conventional ring channel TFT, the channel region is in contact with only the gate insulation film on the outer periphery thereof and the drain and the source regions formed in an upper level and in a lower level of the channel region. For this reason, it is difficult to apply a back gate bias to the channel region and a sufficient cut-off characteristic cannot be obtained.

Further, in the DRAM having the conventional ring channel TFT, it is difficult to obtain a sufficient capacitance by means of the capacitor 12 comprised of the silicon substrate 5, the capacitor insulation film 9 and the charge storage layer 1d.

SUMMARY OF THE INVENTION

It is accordingly an object of the present invention to provide a semiconductor device in which the integration density of DRAMs can be increased, the cut-off characteristic of a transistor can be improved and a sufficient capacitance of the capacitor can be maintained.

According to an aspect of the present invention, there is provided a semiconductor device comprising:

a semiconductor substrate of a first conductivity type;

a first insulation film formed on a surface of the semiconductor substrate;

a gate electrode formed on the first insulation film;

a second insulation film formed on the first insulation film and the gate electrode;

a cylindrical gate insulation film formed on a surface of the gate electrode which is exposed in a trench formed to extend through the second insulation film, the gate electrode and the first insulation film to an interior of the semiconductor substrate;

a capacitor insulation film formed on a surface of the semiconductor substrate which is exposed in the trench;

a cylindrical conductive film including a region doped with an impurity of the first conductivity type and formed on the gate insulation film, a region doped with an impurity of a second conductivity type and formed on a surface of the second insulation film which is exposed in the trench and a region doped with an impurity of the second conductivity type and formed on the capacitor insulation film; and a conductive column formed in a region surrounded by the cylindrical conductive film.

According to another aspect of the present invention, there is provided a semiconductor device comprising:

a semiconductor substrate of a first conductivity type;

a first insulation film formed on a surface of the semiconductor substrate;

a gate electrode formed on the first insulation film;

a second insulation film formed on the first insulation film and the gate electrode;

a cylindrical gate insulation film formed on a surface of the gate electrode which is exposed in a trench formed to extend through the second insulation film, the gate electrode and the first insulation film to an interior of the semiconductor substrate;

a capacitor insulation film formed on a surface of the semiconductor substrate which is exposed in the trench;

a cylindrical conductive film including a region doped with an impurity of the first conductivity type and formed on the gate insulation film, a region doped with an impurity of a second conductivity type and formed on a surface of the second insulation film which is exposed in the trench and a region doped with an impurity of the second conductivity type and formed on the capacitor insulation film;

a cylindrical third insulation film formed on an inner surface of the cylindrical conductive film; and a conductive column formed in a region surrounded by the cylindrical third insulation film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4A to 7C are cross-sectional views showing

DETAILED DESCRIPTION OF THE PREFERRED EMBODIMENTS

In a semiconductor device of the present invention, a channel region is formed in a cylindrical conductive film and a conductive column made of, for example, monocrystalline silicon doped with an impurity, is formed in the center bore of the cylindrical film. When a bias is applied to the conductive column, a back gate bias can easily be applied to the channel region, which was difficult in the conventional semiconductor device. Accordingly, the present invention allows improvement of the cut-off characteristic of a transistor.

In particular, if the conductive column is electrically connected to a semiconductor substrate, the back gate bias can be applied from the substrate to the channel region.

Further, since a PN junction is formed between the conductive column and a cylindrical conductive film situated in the outer periphery of the column, it is possible to obtain a PN junction capacitance. Moreover, if an insulation film is formed between the cylindrical conductive film and the conductive column, the area of a capacitor can be increased. In any case, the capacitance of the capacitor can be increased by virtue of the conductive column formed in the center bore of the cylindrical conductive film.

Embodiments of the present invention will now be described in detail with reference to the accompanying drawings.

EXAMPLE 1

Figure 4A:
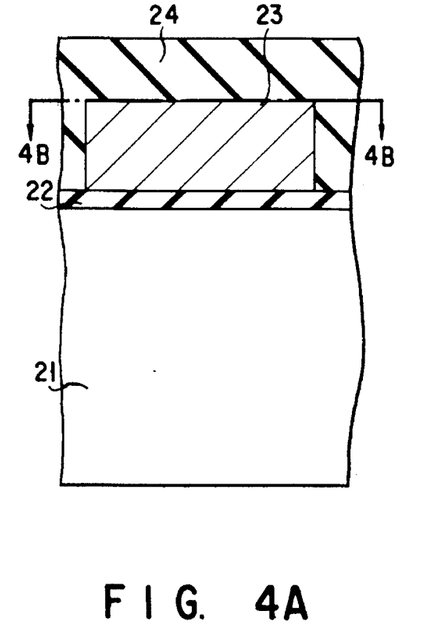

FIGS. 4A to 7H show steps of fabricating a semiconductor device according to a first embodiment of the present invention. First, as shown in FIG. 4A, a first insulation film 22 made of $SiO_2$ or the like is formed on a surface of a P-type Si substrate 21 by, for example, a CVD method. Subsequently, a film of a conductive material (e.g., polycrystalline silicon) is deposited on the first insulation film 22 by, for example, an LPCVD method and then patterned, thereby forming a gate electrode 23 serving as a word line. Further, a second insulation film 24 made of $SiO_2$ or the like is formed on the gate electrode 23 and the first insulation film 22 by, for example, the CVD method.

Figure 4B:
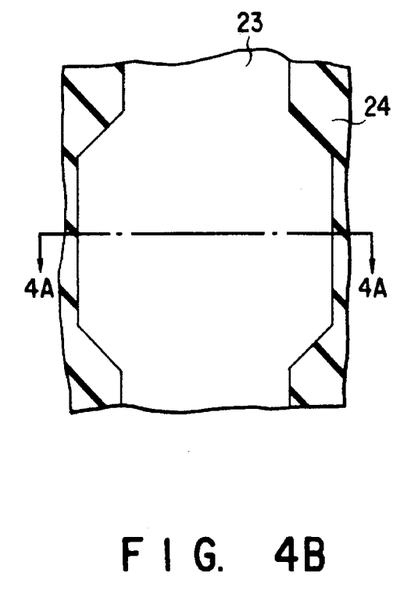

The cross section of the structure of FIG. 4A taken along the line 4B—4B is shown in FIG. 4B. In other words, the longitudinal cross section as shown in FIG. 4A corresponds to the cross section of the structure of FIG. 4B taken along the line 4A—4A.

Figure 5A:
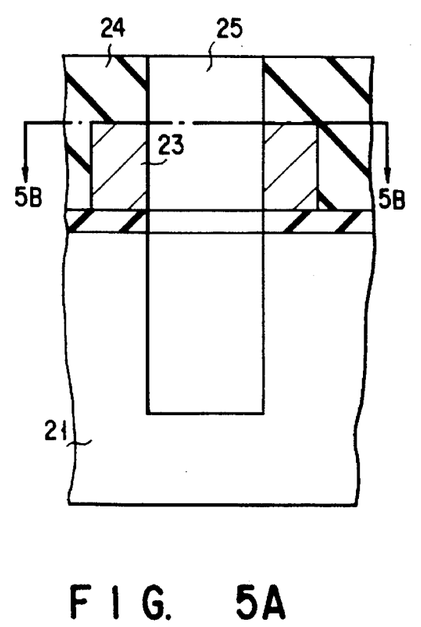

In a subsequent step, as shown in FIG. 5A, a trench 25 is formed through the second insulation film 24, the gate electrode 23 and the first insulation film 22, so as to extend to a predetermined depth in the substrate 21, by an RIE (Reactive Ion Etching) method or the like.

Figure 5B:
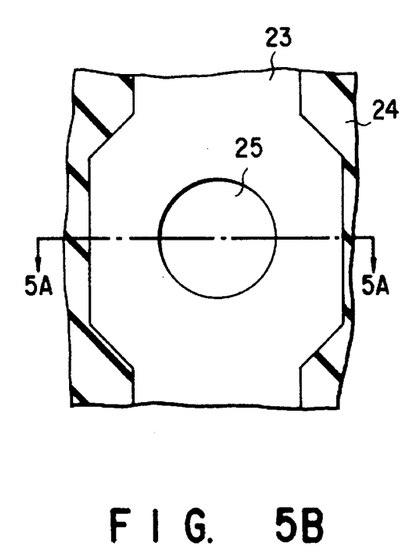

The cross section of the structure of FIG. 5A taken along the line 5B—5B is shown in FIG. 5B. In other words, the longitudinal cross section as shown in FIG. 5A corresponds to the cross section of the structure of FIG. 5B taken along the line 5A—5A.

Figure 6A:
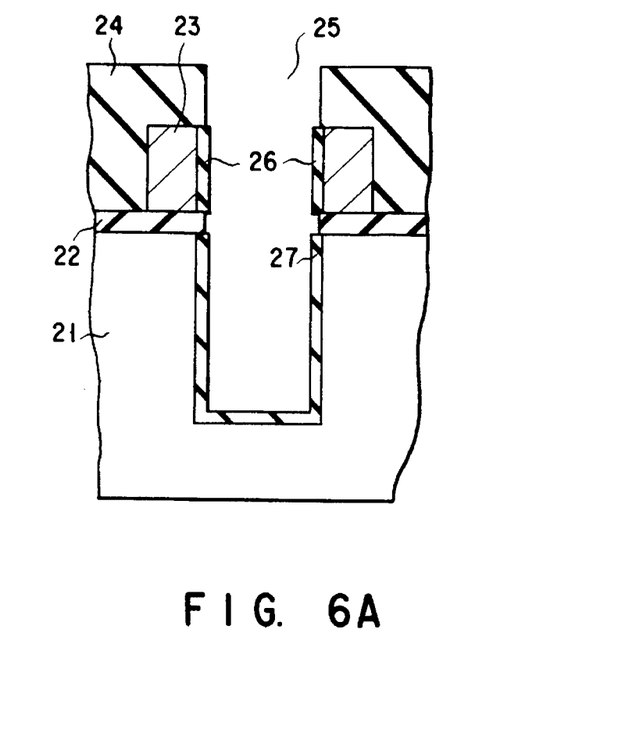

In a subsequent step, about 10 nm insulation film made of $SiO_2$ are formed on the interior surface of the trench 25 by, for example, thermal oxidation. That is, as shown in FIG. 6A, a gate insulation film 26 is formed 10 on the surface of the gate electrode 23 which is exposed in the trench 25 and a capacitor insulation film 27 is formed on the surface of the substrate 21 which is exposed in the trench 25.

Figure 6B:
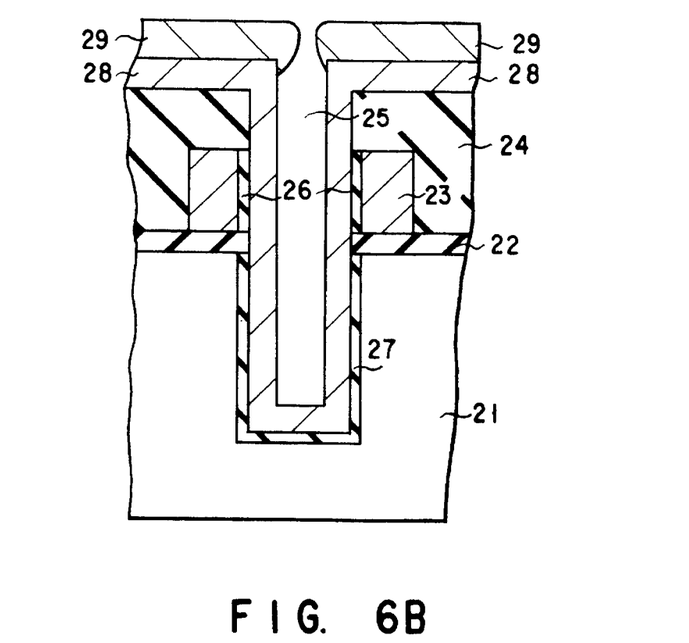

In a subsequent step, an undoped Si film 28 is formed on the interior surface of the trench 25 and the upper surface of the second insulation film 24 by the CVD method or the like such that a space remains in the trench 25. Further, an etching-resistive mask 29, made of, for example, $SiO_2$, is formed on an upper surface of the undoped Si film 28 above the second insulation film 24 by, for example, the CVD method. It is particularly preferable that the $SiO_2$ film be formed under a reduced pressure at a temperature of 450° C. by a silane-acid reaction, since migration of reaction atoms does not occur, with the result that only a negligible amount of $SiO_2$ is deposited on the bottom of the trench 25, as shown in FIG. 6B.

Figure 6C:
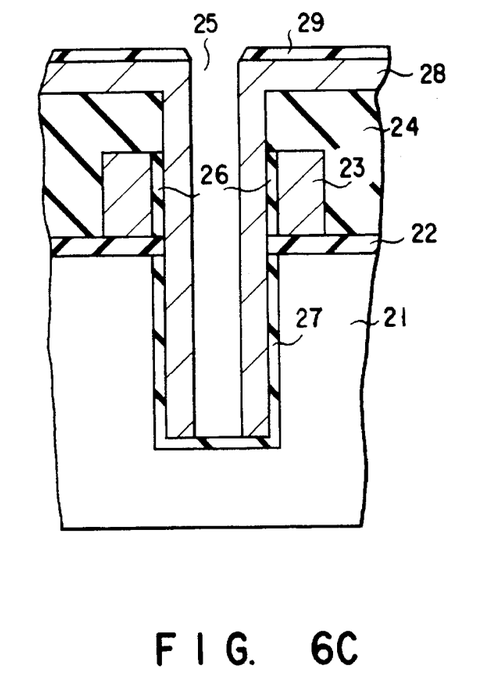

In a subsequent step, as shown in FIG. 6C, the overall surface of the substrate is etched back by the RIE, thereby removing the undoped Si film 28 formed on the bottom of the trench 25. The etching-resistive mask 29 is removed by $NH_4$ etching or the like.

Figure 6D:
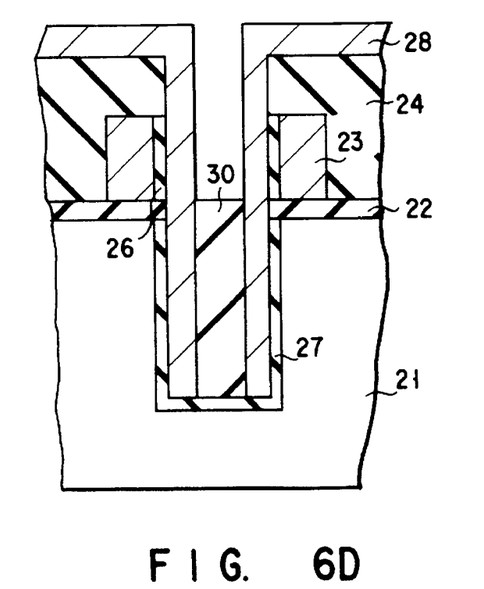

Then, an insulation film formed of AsSG or PSG doped with an N-type impurity is formed in the space bore remained in the trench 25 by the CVD or the like. The impurity concentration can be about $10^{18}$–$10^{20}$/cm$^3$. Thereafter, this insulation film is etched back by the RIE so that the surface of the film is on a level with the bottom surface of the gate electrode 23, thereby forming a first N-doped film 30 as shown in FIG. 6D.

Figure 6E:
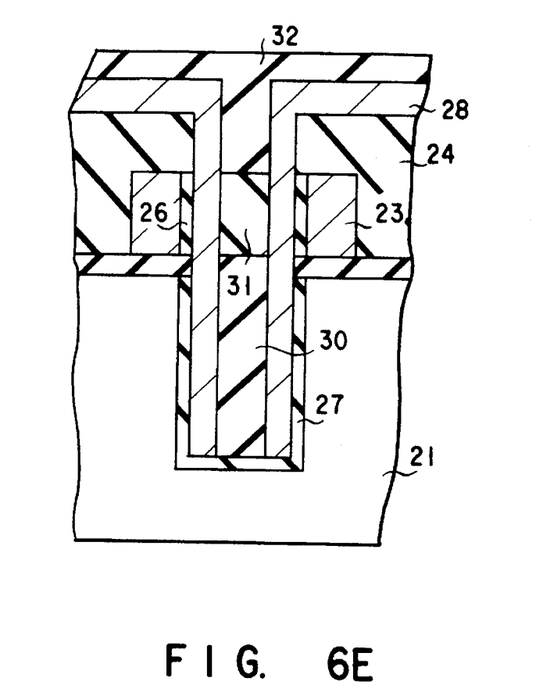

An insulation film made of BSG (Boron-Silicate Glass) doped with a P-type impurity to a concentration of about $10^{16}$–$10^{18}$/cm$^3$ is deposited on the first N-doped film 30 by the CVD method or the like. Then, this insulation film is etched back by the RIE method so that the surface of the film is on a level with the top surface of the gate electrode 23, thereby forming a P-doped film 31. Further, an insulation film doped with an N-type impurity to a concentration of about $10^{18}$–$10^{20}$/cm$^3$ is deposited on the P-doped film 31 in the same manner as in the case of the formation of the first N-doped film 30. As a result, a second N-doped film 32 is formed.

Through the aforementioned deposition and removal steps, the first N-doped film 30, the P-doped film 31 and the second N-doped film 30 are successively formed in the trench 25. In other words, three layers are coaxially formed in the trench 25: an outermost layer consisting of the insulation films 26 and 27; a middle layer of the undoped Si film 28; and a central layer consisting of the doped films.

Figure 6F:
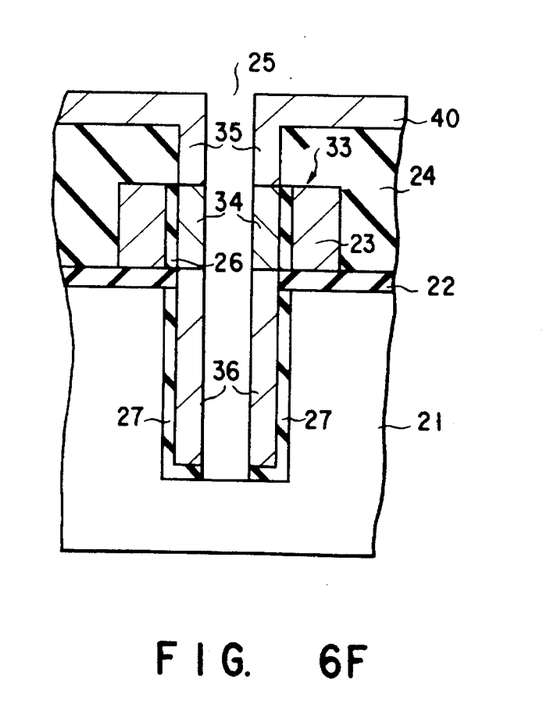

The substrate having the deposited trench 25 is subjected to heat treatment at a temperature of about 800° to 1000° C. As a result, the N-type and P-type impurities doped in the insulation films 30 to 32 are diffused into the undoped Si film 28 which is in contact with the outer periphery of the films 30 to 32. Then, the substrate is subjected to an etching process using $NH_4F$, thereby removing the doped insulation films 30, 31 and 32 in the trench 25, forming a center bore as shown in FIG. 6F.

As a result, a P-type diffusion region 34 is formed on the gate insulation film 26 on the inner sidewall of the gate electrode 23. N-type diffusion regions 35 and 36 are respectively formed on and under the P-type diffusion region 34. Thus, a ring channel TFT 33, comprising a conductive film (including the P-type diffusion region 34 serving as a channel, the N-type diffusion region 35 serving as a drain and the N-type diffusion region 36 serving as a source), the gate insulation film 26 and the gate electrode 23, is formed. The drain region 35 is connected to a bit line 40.

Figure 6G:
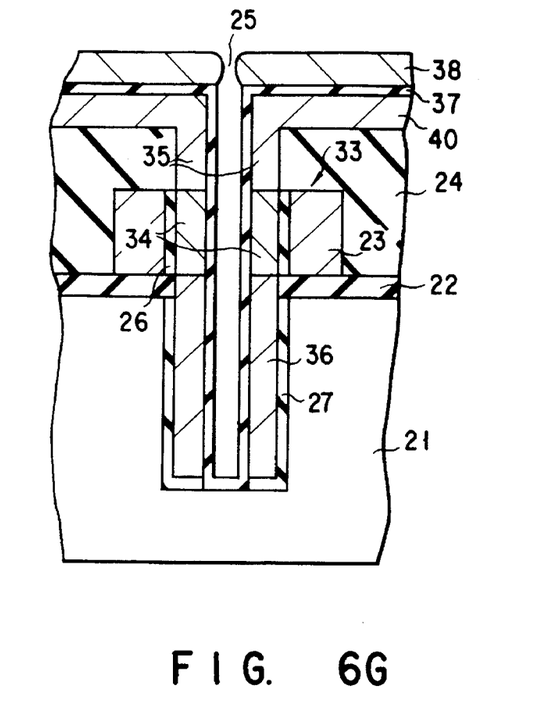

Subsequently, as shown in FIG. 6G, a third insulation film 37 made of $SiO_2$ or the like is formed on the interior surface of the trench 25 and the surface of the bit line 40. For example, thermal oxidation can be employed to form the third insulation film 37. It is preferable that the thickness of the third insulation film 37 be thinner than that of the capacitor insulation film 27, for example, about 8–9 nm. Further, an Al film 38 is formed on the third insulation film 37 above the bit line 40. It is preferable that the Al film be formed by a sputtering method, since only a negligible amount of Al film is deposited on the bottom of the trench 25.

Figure 6H:
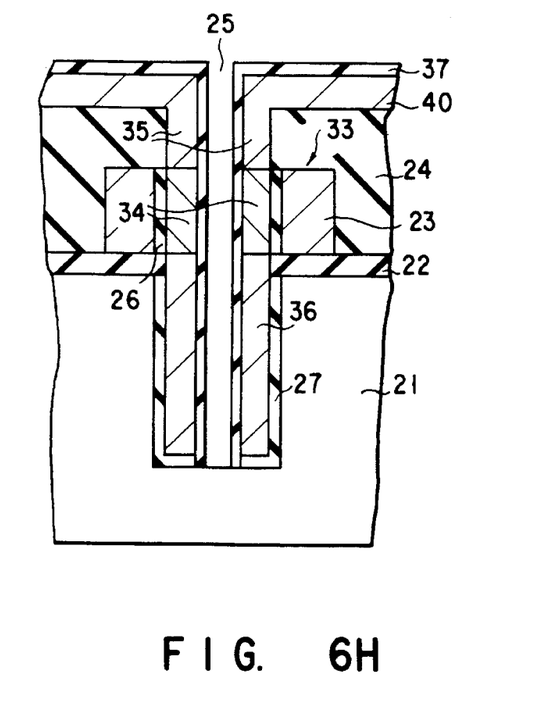

Thereafter, the overall surface of the substrate is etched back by the RIE method, thereby removing that portion of the third insulation film 37 which is formed on the bottom of the trench 25. Further, the Al film 38 is removed by a sulfuric acid-type solvent or a phosphoric acid, with the result that a structure as shown in FIG. 6H is obtained. Then, the interior of the trench 25 and the surface of the third insulation film 37 are washed with an aqueous solution of hydrogen peroxide.

In a subsequent step, a conductive column 39 made of monocrystalline Si or the like doped with a P-type impurity, such as B, to a concentration of about $10^{16}$–$10^{19}$/cm$^3$ is formed in the center bore of the trench 25 by a selective epitaxial growth (SEG) technique or the like.

The conductive column 39 can be formed by any other method, so long as it is formed in the trench 25, while an impurity is being introduced therein. For example, a conductive column 39 can be formed of a metal, in which case a barrier metal layer made of, for example, Ti/N, is formed in a lower portion of the trench, and an upper portion made of metal, such as Al, is formed on the barrier metal layer.

Figure 7A:
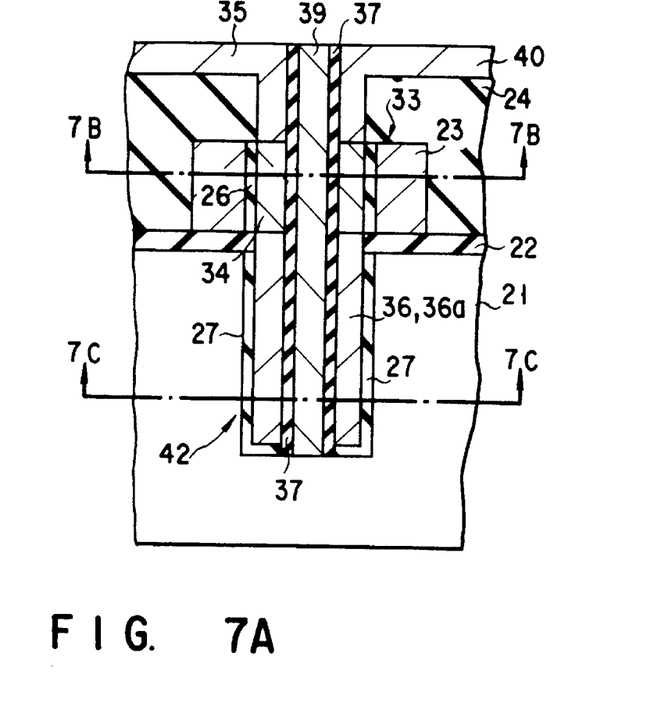

Finally, the surface of the conductive column is polished, so that the conductive column 39 is filled in the trench 25, as shown in FIG. 7A, thereby obtaining a DRAM cell according to the present invention.

As shown in FIG. 7A, the DRAM cell of this embodiment comprises the ring channel TFT 33 including the drain region 35 connected to the bit line 40, the source region 36, the channel region 34, the gate insulation film 26 and the gate electrode 23 serving as a word line. It also comprises a capacitor 42 including the silicon substrate 21, the capacitor insulation film 27, the source region 36 serving as a charge storage layer, the third insulation film 37 and the conductive column 39.

Figure 7B:
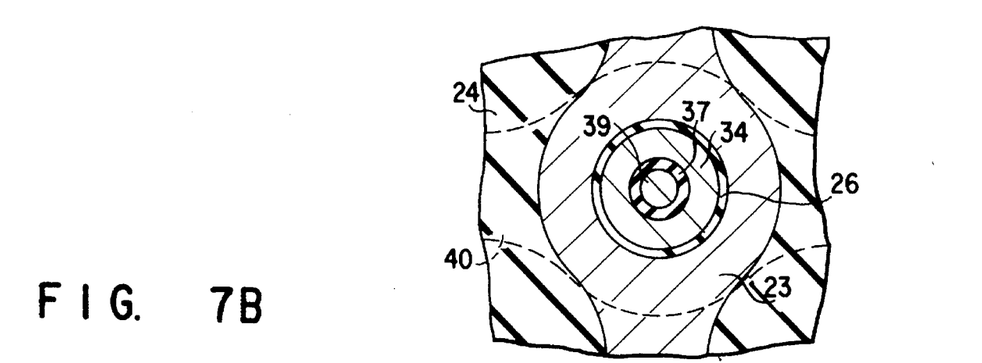

FIGS. 7B and 7C are cross-sectional views of the DRAM cell respectively taken along the lines 7B—7B and 7C—7C in FIG. 7A. In the ring channel TFT 33, as shown in FIG. 7B, the gate insulation film 26, the P-type diffusion region 34 serving as a channel region and the third insulation film 37 are formed in this order on the inner circumferential surface of the gate electrode 23. Further, the column 39 made of doped Si is filled in a region surrounded by the third insulation film 37.

Figure 7C:
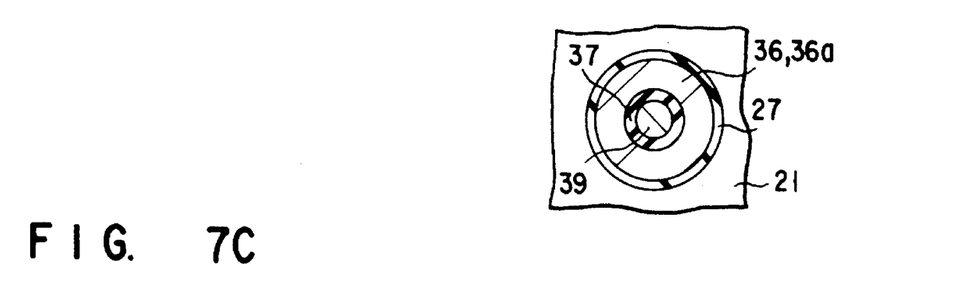

In the capacitor 42, as shown in FIG. 7C, the charge storage layer, i.e., the source region (N-type diffusion region) 36 and the third insulation film 37 are formed in this order on the inner circumferential surface of the capacitor insulation film 27. Further, the column 39 made of doped Si is filled in a region surrounded by the third insulation film 37.

According to the first embodiment, the Si column 39 doped with the P-type impurity is filled in a region surrounded by the ring-shaped channel region (P-type diffusion region) 34 so as to be brought into contact with the substrate 21 at its bottom. With this structure, a back gate bias can easily be applied to the channel region by applying a bias to the Si column 39. Hence, the cut-off characteristic of the transistor can be improved.

Moreover, the third insulation film 37 is formed between the conductive Si column 39 and a cylindrical conductive film including the regions 34, 35 and 36 in which the impurities are diffused. The area of the capacitor 42 is therefore increased as compared to that in the conventional device. As a result, the capacitance of the capacitor can be increased. If the third insulation film 37 is thinner than the capacitor insulation film 27, the capacitance can be much more increased than that in the case of the conventional device.

EXAMPLE 2

FIGS. 8A to 8E are cross-sectional views showing steps of fabricating a semiconductor device according to a second embodiment of the present invention.

Figure 8A:
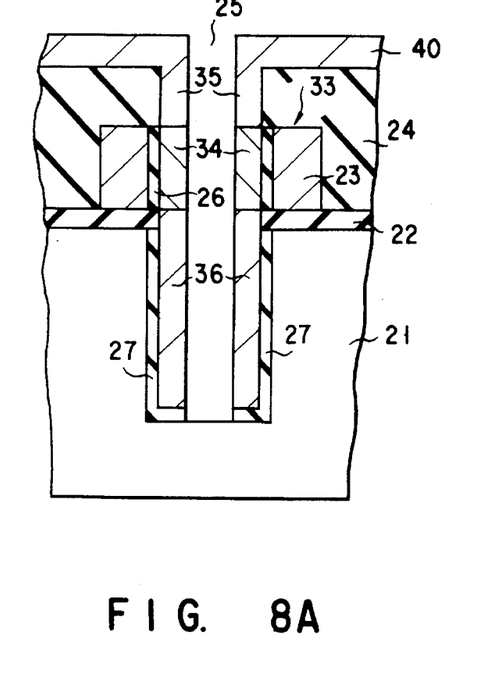
FIGS. 8A to 8E are cross-sectional views showing steps of fabricating a semiconductor device according to a second embodiment of the present invention.
Figure 8B:
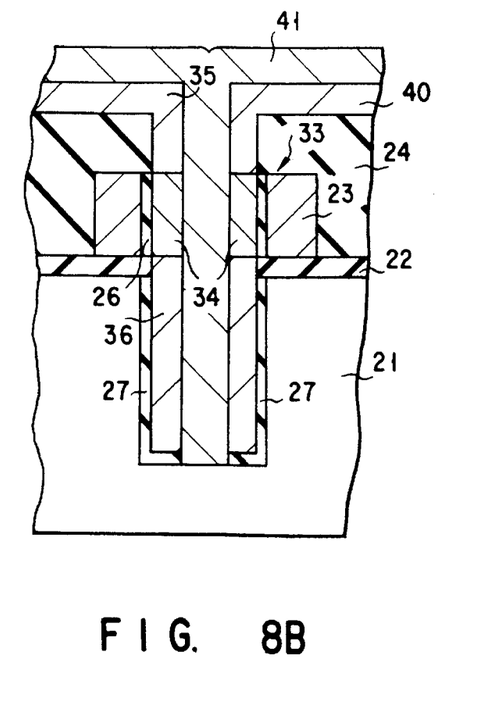

First, the structure shown in FIG. 8A is formed in the same steps as in Example 1, as described above with reference to FIGS. 4A to 6E. Then, monocrystalline Si doped with a P-type impurity, such as B, to a concentration of about $10^{16}$–$10^{18}$/cm$^3$ is formed in the trench 25 (on the doped regions 34, 35 and 36) and an upper surface of the bit line 40 by a selective epitaxial growth (SEG) technique. As a result, a P-type epitaxial layer 41 is formed, as shown in FIG. 8B.

Figure 8C:
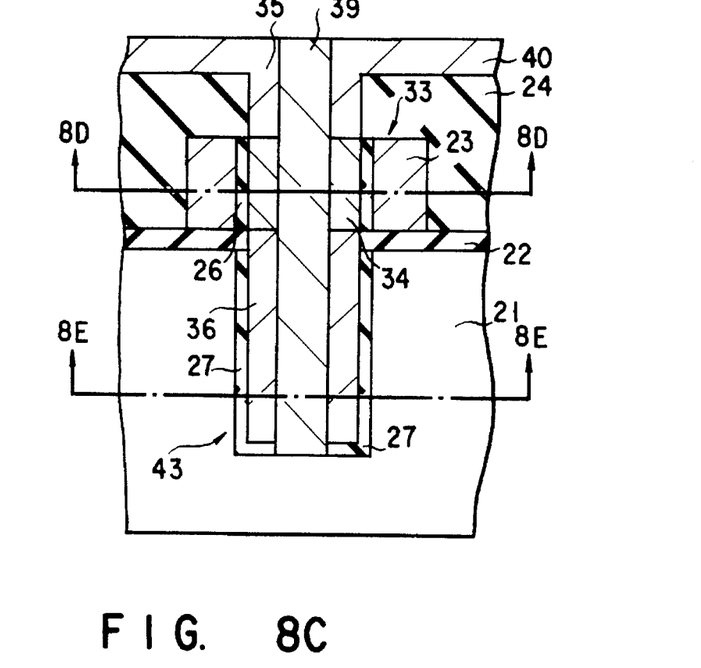

Finally, the P-type epitaxial layer 41 is polished by CMP (Chemical Mechanical Polishing), until the surface of the bit line 40 is exposed and a P-type Si column 39 is filled in the trench 25 as shown in FIG. 8C.

In this embodiment, since the cylindrical conductive film including the doped regions 34, 35 and 36 is in direct contact with the conductive column 39, it is preferable that the type of the impurity used in the SEG be the same as that of the impurity diffused in the channel region 34.

As a result, a DRAM cell having one transistor and one capacitor can be obtained.

As shown in FIG. 8C, the DRAM cell of this embodiment comprises a ring channel TFT 33 including the drain region 35 connected to the bit line 40, the source region 36, the channel region 34, the gate insulation film 26 and the gate electrode 23 serving as a word line. It also comprises a capacitor 43 including the silicon substrate 21, the capacitor insulation film 27, the source region 36 serving as a charge storage layer, and the conductive column 39.

Figure 8D:
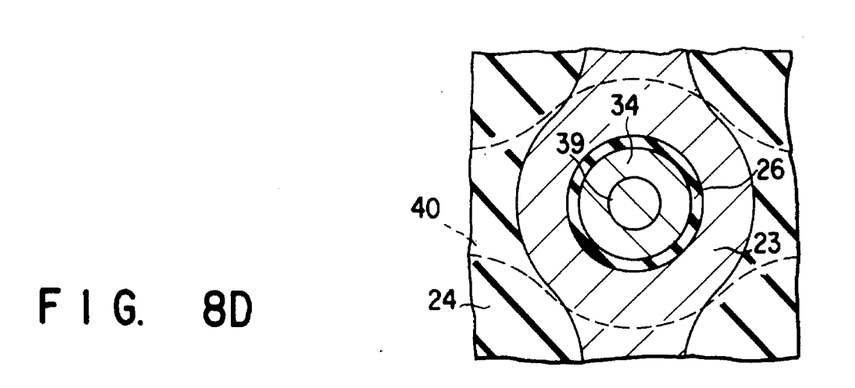

FIGS. 8D and 8E are cross-sectional views of the DRAM cell respectively taken along the lines 8D—8D and 8E—8E in FIG. 8C. In the ring channel TFT 33, as shown in FIG. 8D, the gate insulation film 26 and the P-type diffusion region 34 serving as a channel region are formed in this order on the inner circumferential surface of the gate electrode 23. Further, the column 39 made of Si doped with a P-type impurity is filled in a region surrounded by the P-type diffusion region 34.

Figure 8E:
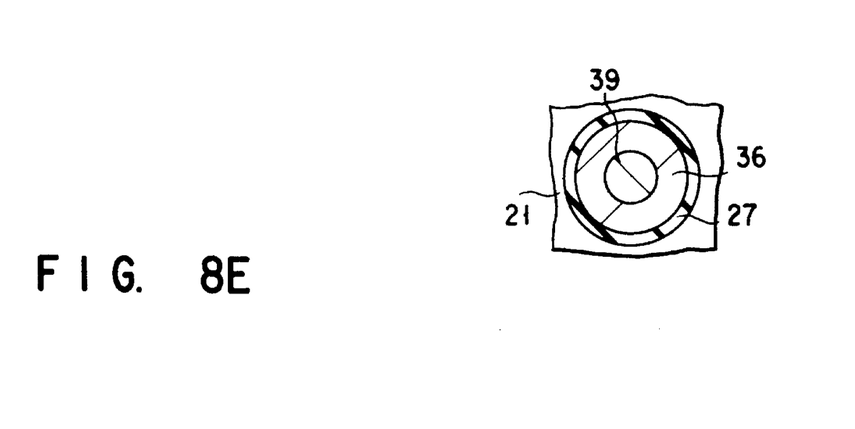

In the capacitor 43, as shown in FIG. 8E, the charge storage layer, i.e., the source region (N-type diffusion region) 36 is formed on the inner circumferential surface of the capacitor insulation film 27.

Further, the column 39 made of Si doped with the P-type impurity is filled in a region surrounded by the source region 36.

In the DRAM cell of the second embodiment, the bottom of the Si column 39 doped with P-type impurity is in contact with the substrate 21 and part of the side surface of the Si column 39 is in contact with the channel region 34, with this structure, since the potential of the silicon substrate 21 can be directly applied to the channel region 34, the cut-off characteristic of the transistor can be further improved.

Moreover, in the capacitor 43 of the DRAM cell of this embodiment, part of the side surface of the P-type Si column is in direct contact with the N-type cell capacitor region 36. With this structure, since a PN junction capacitance obtained by this P-N junction is added to the capacitance of the capacitor 43, the cell capacitance is much more increased than that of the conventional device.

EXAMPLE 3

Figure 9A:
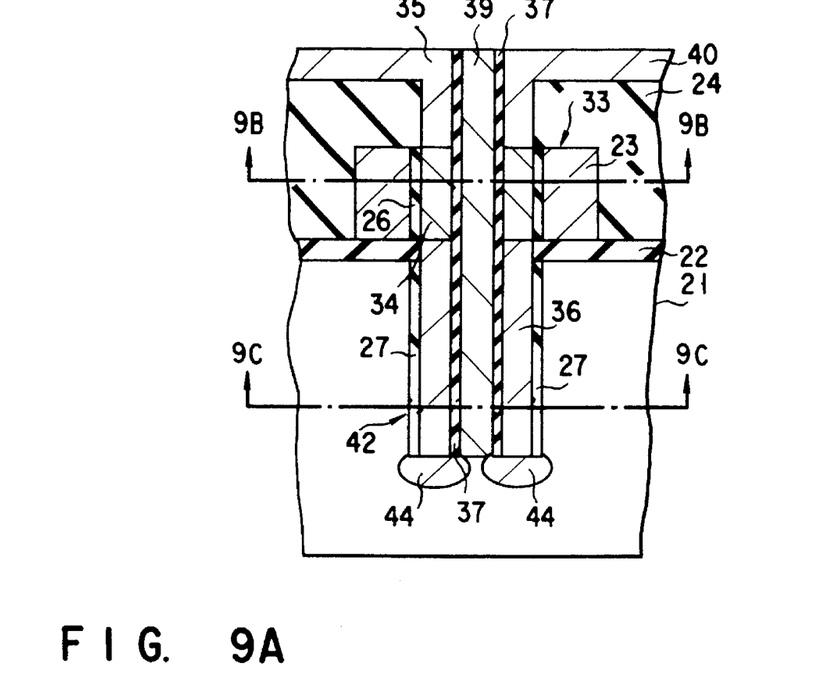
FIGS. 9A to 9C are cross-sectional views showing steps of fabricating a semiconductor device according to a third embodiment of the present invention.
Figure 9B:
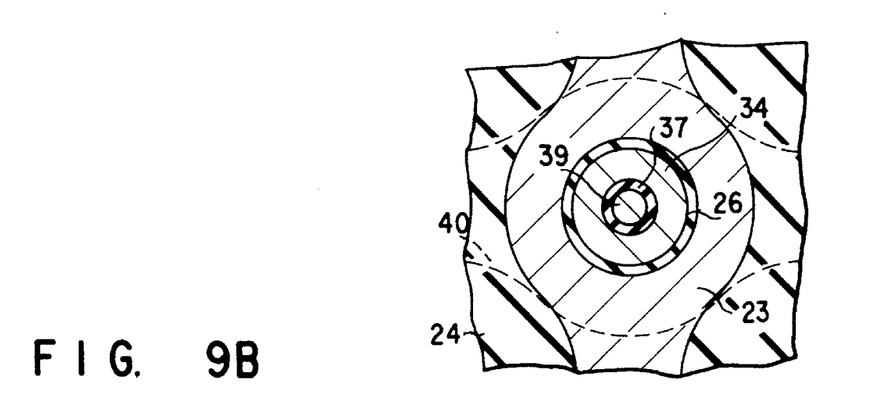
Figure 9C:
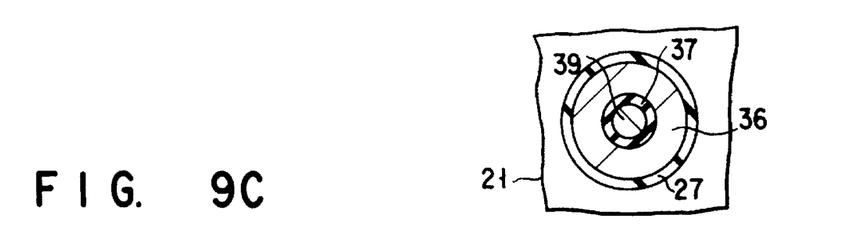

FIGS. 9A to 9C are cross-sectional views showing steps of fabricating a semiconductor device according to a third embodiment of the present invention.

Insulation films 26 and 27 are formed in the same steps as in Example 1 and thereafter the capacitor insulation film 27 formed on the bottom of the trench 25 is removed by the RIE method, as described above with reference to FIGS. 4A to 6A. Subsequently, in the same manner as in Example 1, a cylindrical undoped Si film is formed in the trench, as shown in FIG. 6B. Insulation films 30, 31 and 32 doped with predetermined impurities are successively formed to predetermined levels in the cylindrical film, as shown in FIGS. 6D and 6E. The impurities are diffused into the cylindrical undoped Si film by a heat treatment, thereby forming diffusion regions 34, 35 and 36. Then, the insulation films situated in the center bore of the cylindrical film are removed by an etching process using NH$_4$. Thereafter, a third insulation film 37 is formed in the interior surface of the trench and only the portion of the film 37 formed on the bottom of the trench is removed.

Then, monocrystalline Si doped with a P-type impurity, such as B, to a concentration of about $10^{16}$–$10^{20}$/cm$^3$ is deposited in a region surrounded by the insulation film 37 in the trench 25 by the selective epitaxial growth (SEG) technique.

Finally, the surface of the conductive Si layer is polished by CMP (Chemical Mechanical Polishing), until the surface of the bit line 40 is exposed. A column 39 formed of the conductive Si layer is thus filled in the trench 25 as shown in FIG. 9A.

As a result, a DRAM cell having one transistor and one capacitor can be obtained.

As shown in FIG. 9A, the DRAM cell of this embodiment comprises a ring channel TFT 33 including the drain region 35 connected to the bit line 40, the source region 36, the channel region 34, the gate insulation film 26 and the gate electrode 23 serving as a word line. It also comprises a capacitor 42 including the silicon substrate 21, the capacitor insulation film 27, the source region 36 serving as a charge storage layer, the third insulation film 37 and the conductive column 39.

FIGS. 9B and 9C are cross-sectional views of the DRAM cell respectively taken along the lines 9B—9B and 9C—9C in FIG. 9A. In the ring channel TFT 33, as shown in FIG. 9B, the gate insulation film 26, the P-type diffusion region 34 serving as a channel region and the third insulation film 37 are formed in this order on the inner circumferential surface of the gate electrode 23. Further, the conductive Si column 39 is filled in a region surrounded by the third insulation film 37.

In the capacitor 42, as shown in FIG. 9C, the charge storage layer, i.e., the source region (N-type diffusion region) 36 and the third insulation film 37 are formed in this order on the inner circumferential surface of the capacitor insulation film 27. Further, the conductive Si column 39 is filled in a region surrounded by the third insulation film 37.

In the DRAM cell of this embodiment, similar to the first embodiment, the conductive Si column 39 doped with the P-type impurity is filled in the region surrounded by the ring-shaped channel region (P-type diffusion region) 34 so as to be brought into contact with the substrate 21 at its bottom. With this structure, a back gate bias can easily be applied to the channel region by applying a bias to the Si column 39. Hence, the cut-off characteristic of the transistor can be improved.

Moreover, since the third insulation film is formed between the conductive Si column 39 and the N-type diffusion region 36, the area of the capacitor 42 is therefore increased as in the first embodiment. As a result, the capacitance of the capacitor can be increased.

Furthermore, in the DRAM cell of this embodiment, an N⁺ region 44 is formed under the charge storage layer of the capacitor 42 as shown in FIG. 9A.

As has been described above, according to the present invention, since the conductive column is formed in the region surrounded by the ring-shaped channel region, a back gate bias can be applied from the substrate to the channel region through the conductive column. Therefore, the cut-off characteristic of the transistor can be improved.

In addition, the capacitance of the capacitor can be increased by the conductive column. More specifically, if the conductive column is in direct contact with the cylindrical conductive film formed on the outer circumferential surface, the PN junction capacitance obtained by a PN junction is added to the capacitance of the capacitor, with the result that the capacitance is increased. On the other hand, if an insulation film is formed between the conductive column and the cylindrical conductive film, the area of the capacitor is increased, with the result that the capacitance is increased.

Further a portion of, the cylindrical conductive film formed in the trench functions not only the source region of the ring channel TFT but also the charge storage layer of the capacitor. Thus, a DRAM cell having one transistor and one capacitor is obtained.

As described above, a DRAM cell, comprising a transistor having an improved cut-off characteristic and a capacitor having an increased capacitance, can be provided. Therefore, it is possible to produce a semiconductor device having a high integration density. Such a DRAM cell is very valuable in the field of industry.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:

a semiconductor substrate of a first conductivity type;

a first insulation film formed on a surface of said semiconductor substrate;

a gate electrode formed on said first insulation film;

a second insulation film formed on said first insulation film and said gate electrode;

a cylindrical gate insulation film formed on a surface of said gate electrode which is exposed in a trench formed to extend through said second insulation film, said gate electrode and said first insulation film to an interior of said semiconductor substrate;

a capacitor insulation film formed on a surface of said semiconductor substrate which is exposed in said trench;

a cylindrical conductive film including a region doped with an impurity of the first conductivity type and formed on said gate insulation film, a region doped with an impurity of a second conductivity type and formed on a surface of said second insulation film which is exposed in said trench and a region doped with an impurity of the second conductivity type and formed on said capacitor insulation film; and a conductive column formed in a region surrounded by said cylindrical conductive film and electrically connected to said semiconductor substrate.

2. The semiconductor device according to claim 1, wherein said conductive column is made of monocrystalline silicon doped with an impurity.

3. The semiconductor device according to claim 1, wherein a cylindrical third insulation film is formed between said cylindrical conductive film and said conductive column.

4. The semiconductor device according to claim 3, wherein said third insulation film is thinner than said capacitor insulation film.

5. The semiconductor device according to claim 3, wherein said conductive column is doped with an impurity of the first conductivity type.

6. A semiconductor device comprising:

a semiconductor substrate of a first conductivity type;

a first insulation film formed on a surface of said semiconductor substrate;

a gate electrode formed on said first insulation film;

a second insulation film formed on said first insulation film and said gate electrode;

a cylindrical gate insulation film formed on a surface of said gate electrode which is exposed in a trench formed to extend through said second insulation film, said gate electrode and said first insulation film to an interior of said semiconductor substrate;

a capacitor insulation film formed on a surface of said semiconductor substrate which is exposed in said trench;

a cylindrical conductive film including a region doped with an impurity of the first conductivity type and formed on said gate insulation film, a region doped with an impurity of a second conductivity type and formed on a surface of said second insulation film which is exposed in said trench and a region doped with an impurity of the second conductivity type and formed on said capacitor insulation film;

a cylindrical third insulation film formed on an inner surface of said cylindrical conductive film; and a conductive column formed in a region surrounded by said cylindrical third insulation film and electrically connected to said semiconductor substrate.

7. The semiconductor device according to claim 6, wherein said conductive column is made of monocrystalline silicon doped with an impurity.

8. The semiconductor device according to claim 6, wherein said third insulation film is thinner than said capacitor insulation film.

9. The semiconductor device according to claim 6, wherein said conductive column is doped with an impurity of the first conductivity type.

10. A semiconductor device comprising:

a semiconductor substrate of a first conductivity type;

a first insulation film formed on a surface of said semiconductor substrate;

a gate electrode formed on said first insulation film;

a second insulation film formed on said first insulation film and said gate electrode;

a cylindrical gate insulation film formed on a surface of said gate electrode which is exposed in a trench formed to extend through said second insulation film, said gate electrode and said first insulation film to an interior of said semiconductor substrate;

a capacitor insulation film formed on a surface of said semiconductor substrate which is exposed in said trench;

a cylindrical conductive film including a region doped with an impurity of the first conductivity type and formed on said gate insulation film, a region doped with an impurity of a second conductivity type and formed on a surface of said second insulation film which is exposed in said trench and a region doped with an impurity of the second conductivity type and formed on said capacitor insulation film; and a conductive column, doped with an impurity of the first conductivity type, formed within said cylindrical conductive film and in direct contact with an inner surface of said cylindrical conductive film, said conductive column being electrically connected to said semiconductor substrate.

11. A semiconductor memory device including a data storage capacitor and a thin film switching transistor, said semiconductor memory device comprising:

a semiconductor substrate of a first conductivity type;

a first insulation film formed on said semiconductor substrate;

a first conductive film formed on said first insulation film;

a second insulation film formed on said first conductive film;

a trench formed through said second insulation film, said first conductive film and said first insulation film, said trench extending into said semiconductor substrate;

a third insulation film formed on said first conductive film exposed by said trench;

a fourth insulation film formed on said semiconductor substrate exposed by said trench;

a cylindrical second conductive film, having a center bore, formed in said trench and including a first portion of a second conductivity type formed on said second insulation film exposed by said trench, a second portion of the first conductivity type formed on said third insulation film, and a third portion of the second conductivity type formed on said fourth insulation film; and a third conductive film formed in said center bore of said cylindrical second conductive film and electrically connected to said semiconductor substrate, wherein said thin film switching transistor comprises a gate electrode constituted by said first conductive film, a gate insulating film constituted by said third insulation film, a channel region constituted by said second portion of said cylindrical second conductive film, and source/drain regions constituted by said first and third portions of said cylindrical second conductive film, and wherein said data storage capacitor comprises a data storage electrode constituted by said third portion of said cylindrical second conductive film and a plate electrode constituted by said semiconductor substrate and said third conductive film.

12. The semiconductor memory device according to claim 11, further comprising:

a fifth insulation film disposed between said cylindrical second conductive film and said third conductive film.

13. The semiconductor memory device according to claim 12, wherein the thickness of said fifth insulation film is less than the thickness of said fourth insulation film.

14. The semiconductor memory device according to claim 12, wherein the thickness of said fifth insulation film is about 8 to 9 nanometers.

15. The semiconductor memory device according to claim 11, wherein said third conductive film comprises a conductive film doped with an impurity of the first conductivity type which directly contacts said cylindrical second conductive film.

16. The semiconductor memory device according to claim 11, wherein said third conductive film comprises monocrystalline silicon.

17. The semiconductor memory device according to claim 11, further comprising:

an impurity region of the second conductivity type formed in said semiconductor substrate and electrically connected to said third portion of said cylindrical second conductive film.

18. The semiconductor memory device according to claim 11, wherein said first portion of said cylindrical second conductive film is connected to a bit line.

* * * * *